(12) United States Patent  (10) Patent No.: US 8,744,796 B2
Chen et al.  (45) Date of Patent: Jun. 3, 2014

(54) ALGORITHM INTEGRATING SYSTEM AND INTEGRATING METHOD THEREOF

(75) Inventors: Chun-Chia Chen, Hsinchu (TW); Li-Ming Teng, Hsinchu (TW); Yu-Tsao Hsing, Hsinchu (TW)

(73) Assignee: HOY Technologies Co., Ltd., Hsinchu (TW)

( * ) Notice: Subject to any disclaimer, the term of this patent is extended or adjusted under 35 U.S.C. 154(b) by 596 days.

(21) Appl. No.: 13/088,880

(22) Filed: Apr. 18, 2011

(65) Prior Publication Data

US 2012/0089360 A1 Apr. 12, 2012

Related U.S. Application Data

(60) Provisional application No. 61/392,029, filed on Oct. 11, 2010.

(51) Int. Cl.
*G06F 11/00* (2006.01)
*G06F 11/14* (2006.01)

(52) U.S. Cl.
CPC .................................. *G06F 11/1441* (2013.01)
USPC ........................................................ 702/119

(58) Field of Classification Search
CPC ............ G06F 11/1441; G06F 11/1641; G06F 11/165; G06F 11/1658; G06F 11/1679
USPC .................. 702/141, 117, 118, 182–185, 119
See application file for complete search history.

(56) References Cited

U.S. PATENT DOCUMENTS

2002/0144177 A1* 10/2002 Kondo et al. .................... 714/13

* cited by examiner

*Primary Examiner* — Edward Raymond
(74) *Attorney, Agent, or Firm* — Wang Law Firm, Inc.; Li K. Wang; Stephen Hsu

(57) ABSTRACT

The present invention discloses an algorithm integrating system and an integrating method thereof. The algorithm integrating system comprises a receiving module, an analyzing module, and a processing module. The receiving module receives at least one test algorithm. The analyzing module is connected to the receiving module and analyzes the at least one test algorithm to obtain at least one basic element from the at least one test algorithm. The processing module is connected to the analyzing module and screen out the at least one non-duplicate basic element based on the at least one basic element. Then, the processing module integrates the at least one non-duplicate basic element and generates a testing module.

14 Claims, 4 Drawing Sheets

ALGORITHM INTEGRATING SYSTEM AND INTEGRATING METHOD THEREOF

FIELD OF THE INVENTION

The exemplary embodiment(s) of the present invention relates to an algorithm integrating system and an integrating method thereof More specifically, the exemplary embodiment(s) of the present invention relates to an algorithm integrating system and an integrating method thereof which increases computation efficiency and reduces cost.

BACKGROUND OF THE INVENTION

The fast development of the integrated circuit not only improves many technologies but also largely increases the importance of computer and several kinds of electrical consumer products. People have changed their living styles and the development of the related technologies increases the working efficiency of industry and government. The memory plays an important role in the application of integrated circuit because it can temporarily or permanently store data and programs.

As the process of chip becomes more precise and has higher clock, the difficulty and complexity of the testing increase as well. Testing cost has been an important production cost that cannot be neglected. While in the system chip, a great number of and different kinds of memories also increase the testing cost.

The present memory test process is to input test order individually from automatic test equipment (ATE) and to construct a complete test process. However, the control and communication complexity between the memory to be tested and outer automatic test equipment will be increased, and the testing time will be longer using this method.

Thus the present technique puts a built-in self-test (BIST) circuit in the memory to be tested to improve the disadvantage of inputting test order individually. Then the test algorithm in the build-in self-test circuit processes reading and writing actions on the memory to be tested. Although this method reduces the complexity to communicate with the outer test equipment, to ensure memory in the product to work normally and stably, few test algorithms in the built-in self-test circuit is not enough to achieve the required fault coverage. If all of the test algorithms are built in the test circuits, the area cost of the chip will be highly increased. So analyzing test algorithms and deleting redundant test algorithms are necessary steps to shorten test time and to save chip area.

In addition, after manufacturing system chip, the test algorithm will still need to be adjusted or to be added based on different test requirements to perform further test and verification on the product. Here a screening and analyzing structure is needed to analyze if the adjusted or added algorithms can be supported by the built-in self-test circuit in the chip. The screening and analyzing structure can effectively and rapidly screen out the test algorithm supported by the built-in self-test circuit to reach the targets of reducing product verification schedule and shortening time for product to appear on market.

SUMMARY

A primary object of the present invention is to provide an algorithm integrating system and an integrating method thereof. It helps to reduce the area of built-in self-test circuit on chip, increase fault coverage and reduce test time and cost.

According to an object of the present invention, an algorithm integrating system is disclosed, comprising a receiving module, an analyzing module, and a processing module. The receiving module receives at least one test algorithm. The analyzing module is connected to the receiving module and analyzes the at least one test algorithm to obtain at least one basic element in the at least one test algorithm. The processing module is connected to the analyzing module and screen out at least one non-duplicate basic element based on at least one basic element. Then, the processing module integrates the at least one non-duplicate basic element to produce a testing module.

In the present invention, the processing module takes union of the at least one basic element to screen out the at least one non-duplicate basic element.

In the present invention, the at least one basic element is an operation mode of the at least one test algorithm.

In the present invention, the testing module is a built-in self-test (BIST) circuit.

In the present invention, the analyzing module further analyzes another test algorithm to obtain at least one basic element in the another test algorithm.

In the present invention, the processing module compares the at least one basic element in the another test algorithm and the at least one non-duplicate basic element in the test module.

In the present invention, the processing module determines if the test range of the testing module comprises the test range of the at least one basic element in the another test algorithm based on the compared result.

According to an object of the present invention, an algorithm integrating method applied to an algorithm system is further disclosed, comprising the following steps: receiving at least one test algorithm; analyzing the at least one test algorithm and obtaining at least one basic element in the at least one test algorithm; screening out the at least one non-duplicate basic element based on the at least one basic element; and generating a testing module based on the at least one non-duplicate basic element.

In the present invention, the processing module takes union of the at least one basic element to screen out the at least one non-duplicate basic element.

In the present invention, the at least one basic element belongs to an operation mode of the at least one test algorithm.

In the present invention, the testing module is a built-in self-test (BIST) circuit.

In the present invention, the analyzing module further analyzes another test algorithm to obtain at least one basic element in the another test algorithm.

In the present invention, the processing module further compares the at least basic element in the another test algorithm and the at least one non-duplicate basic element in the test module.

In the present invention, the processing module determine if the test range of the testing module comprises the test range of the at least one basic element in the another test algorithm based on the compared result.

The present invention of the algorithm integrating system and the integrating method above has one or more advantages as the following:

The algorithm integrating system and the integrating method of the present invention can obtain optimized design of the built-in self-test circuit test considering real application and test limitation. It can reduce test chip area, decrease test time, increase fault coverage and yield rate, and reduce test costs.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
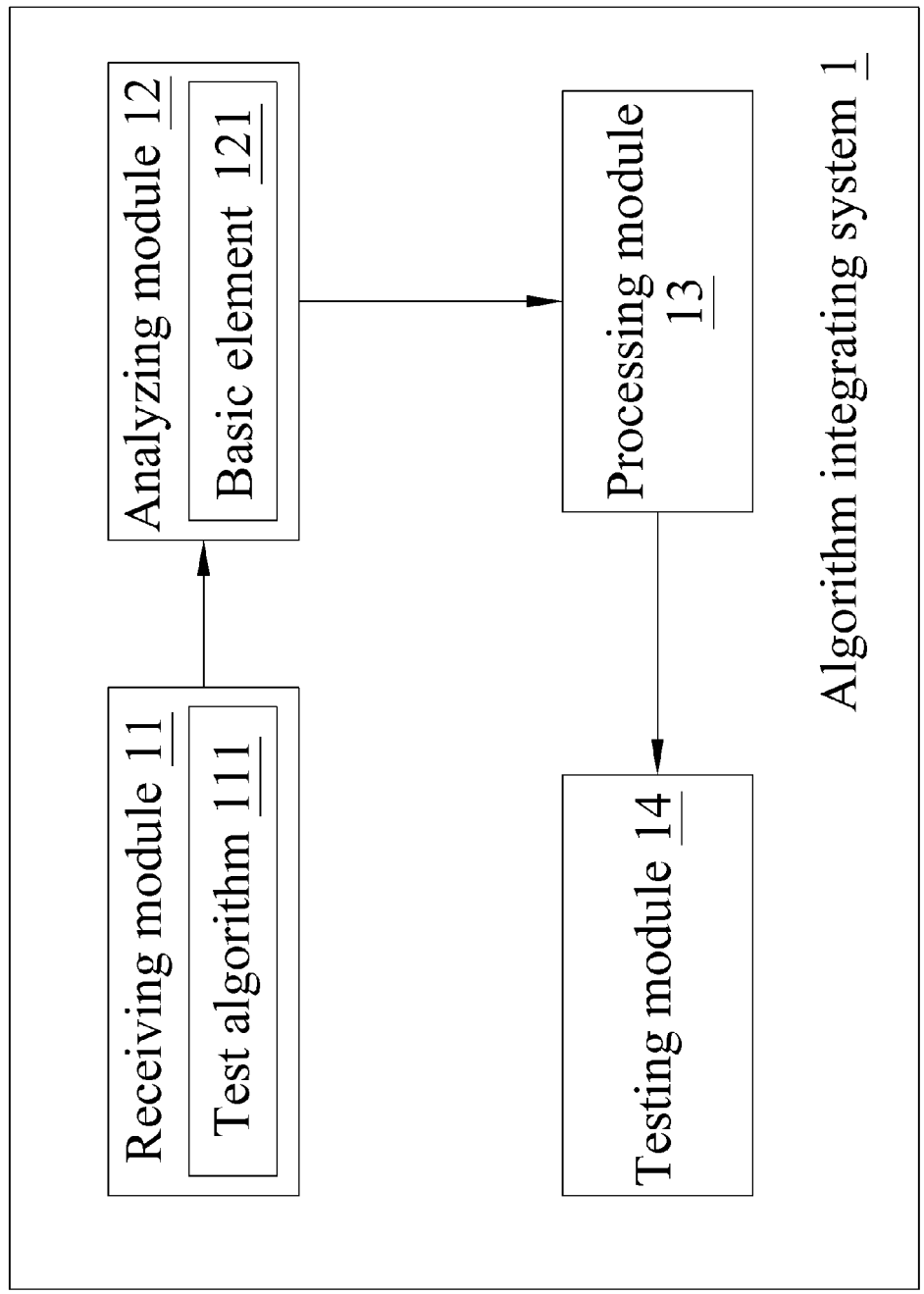
FIG. 1 is a block diagram of an algorithm integrating system according to an embodiment of the present invention.

The present invention will now be described with some preferred embodiments thereof and with reference to the accompanying drawings. For the purpose of being easy to understand, elements that are the same in the preferred embodiments are denoted by the same reference numerals.

Please refer to FIG. 1 that is a block diagram of an algorithm integrating system according to an embodiment of the present invention. As shown, the algorithm integrating system 1 comprises a receiving module 11, an analyzing module 12, a processing module 13 and a testing module 14. The receiving module 11 receives at least one test algorithm 111. The analyzing module 12 is connected to the receiving module 11 and analyzes the at least one test algorithm 111 to obtain an at least one basic element 121 in the at least one test algorithm 111. The at least one basic element 121 may be written, read or their combination by the at least one test algorithm 111. The processing module 13 is connected to the analyzing module and takes union to obtain an at least one non-duplicate basic element 121 based on at least one basic element 12. Then, the processing module 13 integrates the at least one non-duplicate basic element 121 to produce a testing module 14. The testing module 14 can be a built-in self-test (BIST) circuit.

Figure 2:
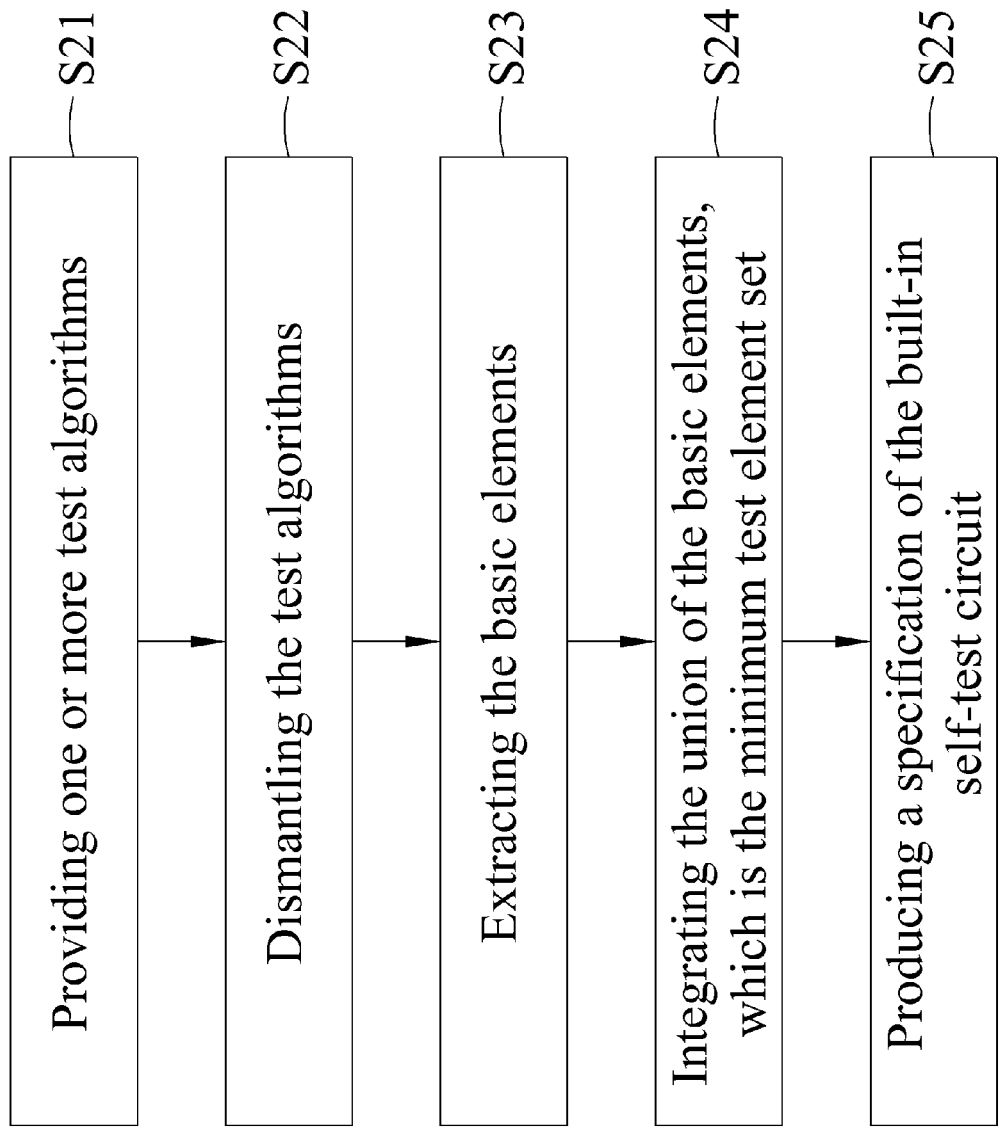
FIG. 2 is a flowchart of a test algorithm to the built-in self-test circuit specification of the algorithm integrating method according to an embodiment of the present invention.

Please refer to FIG. 2 that is a flowchart of a test algorithm to built-in self-test circuit specification of the algorithm integrating method according to an embodiment of the present invention. As shown, the flowchart of this embodiment comprise the following steps: (S21) providing one or more test algorithms; (S22) dismantling the test algorithms; (S23) extracting the basic elements; (S24) integrating the union of the basic elements, which is the minimum test element set; and (S25) producing a specification of the built-in self-test circuit.

The steps (S21) to (S25) mentioned in the previous section can be described in more details as the following: first, the algorithm integrating system of the present invention can transform the test algorithms user chosen into specification of built-in self-test circuit. Take test algorithm MATS and MarchX as examples, MATS is represented as <(wa) >(ra, wb,rb) >(rb,wa,ra) <(ra,wb,rb) <(rb,wa,ra), and MarchX is represented as >(wa) >(ra,wb)<(rb,wa) <(ra). Wherein a and b are binary 8 digits values, and a and b are values in contrast. For the example, if a is 11001010, b is 00110101. And r and w represent reading and writing respectively. Besides, test algorithm has other operation modes such as no operation and erase rather than reading and writing. The embodiment in the previous statement should be considered as the example but not the limitation.

The next step is to purify and dismantle each test algorithm. MATS after dismantling is represented as (w), (r,w,r), (r,w,r), (r,w,r), (r,w,r), while MarchX after dismantling is represented as (w), (r,w), (r,w), (r). Algorithm unit of after dismantling MATS can be extracted as basic elements (w) and (r,w,r) and algorithm unit of after dismantling MarchX can be extracted as (w), (r,w) and (r).

Taking union of the basic elements extracted from the two algorithms can obtain the minimum test element set: (r), (w), (r,w) and (r,w,r). The minimum test element set is transformed into a specification of the built-in self-test circuit to generate design of the built-in self-test circuit on a chip and then built-in self-test circuit entity is manufactured.

The test algorithm screening selection is selecting available test algorithms that can be used in the built-in self-test circuit after the specification of the built-in self-test circuit is determined or the built-in self-test circuit has been manufactured. User may use the selected qualified test algorithms to add into their test bench to test circuits. In addition, even some of the test algorithm is not selected when user sets the built-in self-test circuit specifications, the test algorithm can still be used in the built-in self-test circuit if it meets the screening conditions.

Figure 3:
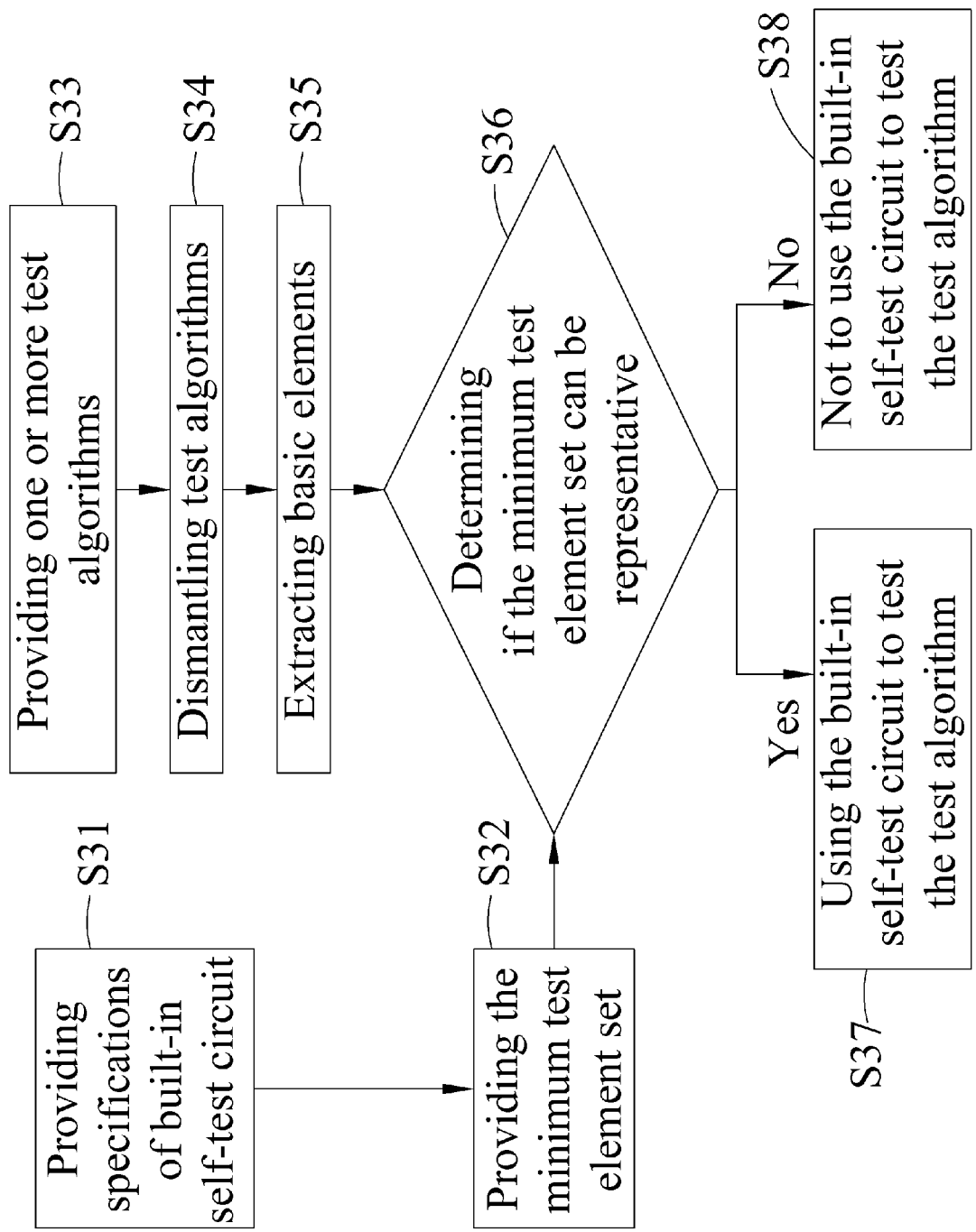
FIG. 3 is a flowchart of a test algorithm screening of the algorithm integrating method according to an embodiment of the present invention.

Please refer to FIG. 3 that is a flowchart of a test algorithm screening of the algorithm integrating method according to an embodiment of the present invention. As shown, the embodiment comprises the following steps: (S31) providing built-in self-test circuit specifications; (S32) providing the minimum test element set; (S33) providing one or more test algorithms; (S34) dismantling test algorithms; (S35) extracting basic elements; (S36) determining if the minimum test element set can be representative. If yes, going to step (S37) using the built-in self-test circuit to test the test algorithm, if not, going to step (S38) not to use the built-in self-test circuit to test the test algorithm.

The steps (S31) to (S38) mentioned above can be described in more details as the following: first, using the minimum test element set in the previous example (r), (w), (r,w) and (r,w,r) to test the newly added test algorithms March C- and March LR. March C- is represented as >(wa) >(ra,wb) >(rb,wa) <(ra,wb) <(rb,wa) <(ra), and March LR is represented as >(wa) <(ra,wb) <(rb,wa,ra,wb) >(rb,wa) >(ra,wb,rb,wa) >(ra). Next, dismantling and purifying these two test algorithms. Dismantled March C is represented as (w), (r,w), (r,w), (r,w), (r,w), (r)and dismantled March LR is represented as (w), (r,w), (r,w,r,w), (r,w), (r,w,r,w), (r). Algorithm unit of dismantled March C- is extracted into basic elements (w), (r,w) and (r), and algorithm unit of March LR after dismantling is extracted into basic elements (w), (r,w), (r,w,r,w) and (r).

Moreover, taking union of the basic elements extracted from the previous example MATS and MarchX can obtain the minimum test element set (r), (w), (r,w) and (r,w,r). The minimum test element set can compose March C- but cannot compose March LR. Thus this built-in self-test circuit can be tested by March C- but cannot be tested by March LR. In addition, user can add March C- into the test bench whereas March LR cannot be added into the test bench.

It is worth mentioning that users in the field should understand that the description of the test algorithm, the built-in self-test circuit and test algorithm screening mentioned in the previous statement are as examples but not limitation of the embodiment of the present invention. Besides, users familiar with the technique can combine what was mentioned above into an integrated analyzing system depending on the convenience of the design, which is mentioned here in advance.

Despite the fact that while explaining the algorithm integrating system and the integrating method of this invention, the algorithm integrating method of this invention has also been illustrated. To be clear, a flowchart is showed for detailed explanation.

Figure 4:
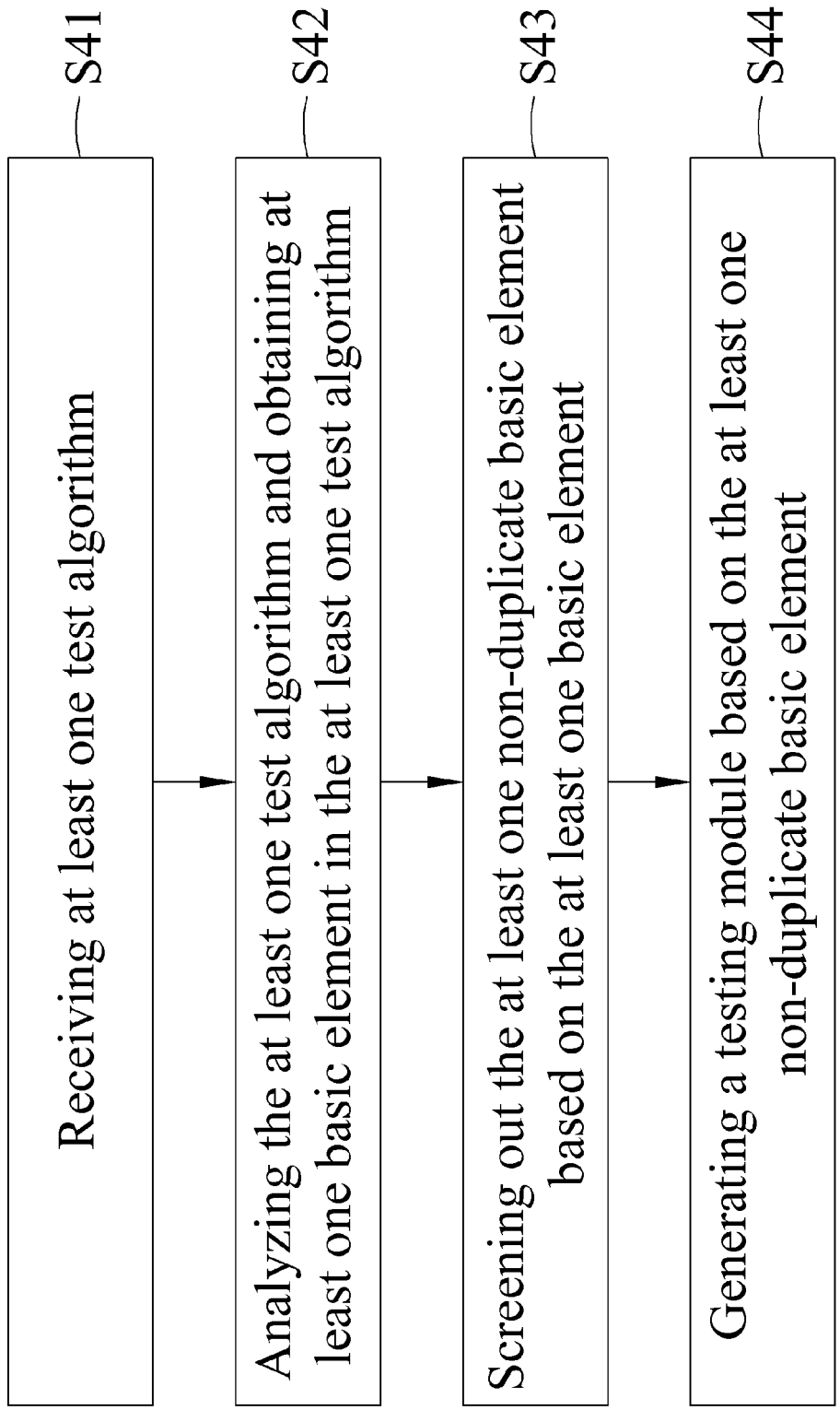
FIG. 4 a flowchart of the algorithm integrating method according to an embodiment of the present invention.

Please refer to FIG. 4 that is a flowchart of the algorithm integrating method according to an embodiment of the present invention. As shown, the algorithm integrating method of the present invention can be applied to an algorithm integrating system. The algorithm integrating system comprises a receiving module, an analyzing module and a processing module. The algorithm integrating method of the algorithm integrating system comprises the following steps:

(S41) receiving at least one test algorithm;

(S42) analyzing at least one test algorithm and obtaining at least one basic element in the at least one test algorithm;

(S43) screening out the at least one non-duplicate basic element based on the at least one basic element; and (S44) generating a testing module based on the at least one non-duplicate basic element.

The algorithm integrating method of the algorithm integrating system according to an embodiment of the present invention has been described in details in the previous statement. It will not be stated again here.

In sum, considering real application and test limitation, the algorithm integrating system and the algorithm integrating method according to an embodiment of the present invention can obtain optimized design of the built-in self-test circuit. It can reduce test chip area and decrease test time for different sizes of memory chips. Thus, fault coverage and yield rate further increase. Conventional equipment testing and repairing costs can be saved as well to reduce the test cost.

The embodiment in the previous statement should be considered as the example but not the limitation. While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. An algorithm integrating system, comprising:
a receiving module receiving at least one test algorithm;
an analyzing module being connected to the receiving module and analyzing the at least one test algorithm to obtain at least one basic element in the at least one test algorithm; and
a processing module being connected to the analyzing module and screening out the at least one non-duplicate basic element based on the at least one basic element and integrating to generate a testing module based on the at least one non-duplicate basic element.

2. The algorithm integrating system as recited in claim 1, wherein the processing module takes union of the at least one basic element to screen out the at least one non-duplicate basic element.

3. The algorithm integrating system as recited in claim 1, wherein the at least one basic element is an operation mode in the at least one test algorithm.

4. The algorithm integrating system as recited in claim 1, wherein the testing module is a built-in self-test (BIST) circuit.

5. The algorithm integrating system as recited in claim 1, wherein the analyzing module further analyzes another test algorithm to obtain at least one basic element in the another test algorithm.

6. The algorithm integrating system as recited in claim 5, wherein the processing module compares the at least one basic element in the another test algorithm and the at least one non-duplicate basic element in the test module.

7. The algorithm integrating system as recited in claim 6, wherein the processing module determines if test range of the testing module comprises test range of the at least one basic element in the another test algorithm based on the compared result.

8. An algorithm integrating method, comprising the following steps:
receiving at least one test algorithm;
analyzing the at least one test algorithm and obtaining at least one basic element in the at least one test algorithm;
screening out the at least one non-duplicate basic element based on the at least one basic element; and
generating a testing module based on the at least one non-duplicate basic element.

9. The algorithm integrating method as recited in claim 8, further comprising the following step:
taking union of the at least one basic element to screen out the at least one non-duplicate basic element.

10. The algorithm integrating method as recited in claim 8, wherein the at least one basic element is an operation mode in the at least one test algorithm.

11. The algorithm integrating method as recited in claim 8, wherein the testing module is a built-in self-test (BIST) circuit.

12. The algorithm integrating method as recited in claim 8, further comprising the following step:
analyzing another test algorithm to obtain at least one basic element in the another test algorithm.

13. The algorithm integrating method as recited in claim 12, further comprising the following step:
comparing at least basic element in the another test algorithm and the at least one non-duplicate basic element in the test module.

14. The algorithm integrating method as recited in claim 13, further comprising the following step:
determining if test range of the testing module comprises test range of the at least one basic element in the another test algorithm based on the compared result.

* * * * *